United States Patent [19]

Dewey et al.

[11] Patent Number: 4,803,700
[45] Date of Patent: Feb. 7, 1989

[54] METHOD OF, AND DEMODULATOR FOR, DIGITALLY DEMODULATING AN SSB SIGNAL

[75] Inventors: Richard J. Dewey, Reigate; Christopher J. Collier, Carshalton Beeches, both of England

[73] Assignee: U.S. Philips Corp., New York, N.Y.

[21] Appl. No.: 872,775

[22] Filed: Jun. 10, 1986

[30] Foreign Application Priority Data

Jun. 12, 1985 [GB] United Kingdom ............... 8514824

[51] Int. Cl.⁴ ............................................. H03D 1/24
[52] U.S. Cl. ........................................ 375/77; 329/50
[58] Field of Search ............... 375/77, 43; 455/202, 455/203; 329/50; 364/724; 370/70; 358/23, 31

[56] References Cited

U.S. PATENT DOCUMENTS

| | | | |
|---|---|---|---|
| 3,984,778 | 10/1976 | Bhopale | 375/77 |
| 4,241,451 | 12/1980 | Maixner et al. | 455/202 |
| 4,344,149 | 8/1982 | van de Meeberg et al. | 364/724 |
| 4,464,770 | 8/1984 | Maurer et al. | 375/77 |
| 4,470,069 | 9/1984 | Lewis, Jr. et al. | 358/31 |
| 4,481,646 | 11/1984 | Godard | 375/77 |
| 4,584,659 | 4/1986 | Stikvoort | 364/724 |
| 4,616,252 | 10/1986 | Sciff | 358/23 |

Primary Examiner—Benedict V. Safourek
Assistant Examiner—Andrew J. Telesz, Jr.
Attorney, Agent, or Firm—Thomas A. Briody; Leroy Eason

[57] ABSTRACT

An SSB signal demodulator comprising an analog bandpass filter for band-limiting such signal, an analog-to-digital converter 20 for digitizing the band-limited signal, and a pair of quadrature related decimating filters (28, 29) for deriving quadrature related decimated signals therefrom which are applied to a Hilbert transform pair (30, 31). The upper or lower sideband signal is obtained by taking the sum or difference of the outputs of the Hilbert transform pair, and the resulting digital signal is reconverted to an analog signal. By using a decimation factor which is an odd numbered integer greater than 1, the periodic transfer function of the demodulator has alternate passbands and stopbands. This relaxes the performance requirements of the analog filter and of the Hilbert transform pair, and greatly enhances the adjacent channel selectivity of the demodulator.

9 Claims, 7 Drawing Sheets

| INV RLSB | RLSB | USB | INV USB | RLSB | USB | INV USB | INV RLSB |
|---|---|---|---|---|---|---|---|
| INV LSB | LSB | RUSB | INV RUSB | LSB | RUSB | INV RUSB | INV LSB |

| INV USB | RLSB | USB | INV USB | INV RLSB | INV USB | RLSB | USB | INV USB | INV RLSB | USB |
|---|---|---|---|---|---|---|---|---|---|---|
| LSB | RUSB | LSB | INV LSB | INV RUSB | INV LSB | RUSB | LSB | INV LSB | INV RUSB | LSB |

| USB/LSB | RLSB | USB | RLSB | INV USB | INV RLSB | USB/LSB | RLSB | USB | RLSB | INV USB | INV RLSB | USB/LSB |
|---|---|---|---|---|---|---|---|---|---|---|---|---|
| RUSB | LSB | RUSB | USB/LSB | INV RUSB | INV LSB | RUSB | LSB | RUSB | USB/LSB | INV RUSB | INV LSB | RUSB |

| RLSB | USB | RLSB | USB | INV RLSB | INV USB | INV RLSB | INV USB | RLSB | USB | RLSB | USB | INV RLSB | INV USB | INV RLSB | INV USB | RLSB |
|---|---|---|---|---|---|---|---|---|---|---|---|---|---|---|---|---|
| LSB | RUSB | LSB | RUSB | INV LSB | INV RUSB | INV LSB | INV RUSB | LSB | RUSB | LSB | RUSB | INV LSB | INV RUSB | INV LSB | INV RUSB | LSB |

METHOD OF, AND DEMODULATOR FOR, DIGITALLY DEMODULATING AN SSB SIGNAL

BACKGROUND OF THE INVENTION

1. Field of the Invention

The present invention relates to a method of, and demodulator for, digitally demodulating a single sideband (SSB) signal.

2. Description of the Related Art

Digital demodulation of an SSB signal is known, for example, from an article entitled "Digital HF Radio: a sampling of techniques" in Ham Radio magazine, April 1985, page 18 et seq., particularly FIGS. 14–16 on pages 31 and 33 and the corresponding description. Typically an IF signal is filtered and applied to an analogue to digital converter (ADC). The ADC output signal is then processed digitally inter alia by effectively creating two quadrature-relating channels by means of quadrature mixers, low-pass filtering and decimating the signals in the two channels, and filtering and arithmetically combining the results. The results of the arithmetic combination may be reconverted to an analogue signal in a digital to analogue converter (DAC). An advantage of processing a signal digitally is that a more flexible or general purpose demodulator can result. However the known methods are liable to require particularly stringent filtering which means that dedicated circuits may have to be made for each stage of the demodulator.

SUMMARY OF THE INVENTION

An object of the present invention is to enable the filtering requirements in a digital demodulator to be relaxed whilst maintaining good selectivity.

According to one aspect of the present invention there is provided a method of demodulating an SSB signal, comprising analog band pass-filtering said signal, quadrature-mixing a signal derived from the result of the analog filtering operation with a local oscillator signal to effectively produce a pair of signals, digitally filtering, with decimation, the respective signals of the pair, and combining signals derived from the respective decimated signals, analog to digital conversion being effected between the analog filtering operation and the digital filtering operation, characterised in that the decimation uses an odd-numbered integer decimation factor greater than 1 and in that the signals which are combined are derived from the respective decimated signals by a process which comprises digitally producing a relative 90 degree phase-shift between the respective decimated signals.

According to another aspect of the present invention there is provided an SSB signal demodulator comprising an analog band pass-filter having an input for an SSB signal, a local oscillator, quadrature-related mixing means to inputs of which outputs of said pass-filter and said local oscillator are coupled, signal combining means, first and second filtering and decimating means coupling first and second outputs of the quadrature-relating mixing means to first and second inputs of the signal combining means respectively, and analog-to-digital converter means included in the couplings from the pass-filter to the first and second filtering and decimating means, characterised in that the filtering and decimating means are each arranged to decimate by an odd-numbered integer factor greater than 1 and in that digital phase-shifting means are provided for producing a relative phase-shift of 90 degrees between the output signals of the filtering and decimating means prior to their being fed to the combining means.

It has now been recognized that selectivity in a demodulator can be improved by initially analogue filtering an input signal and then subsequently digitally filtering the filtered analogue signal. In particular digitally filtering and decimating signals using an odd numbered integer factor greater than 1 and applying the decimated signals to a digital means for producing a relative 90 degree phase-shaft therebetween, for example a Hilbert transform pair, and then combining the results enables a passband/stopband characteristic to be obtained that is characteristic in that a passband is flanked by stopbands. This means that the filtering requirements in the demodulator can be relaxed. The digital part of the demodulator may be implented using a general purpose processor.

In an embodiment of the present invention the digitised signal is mixed with quadrature components of a local oscillator signal as a frequency fc which is mathematically related to the sampling frequency, $f_s$, used in digitising the analogue signal. The mathematical relationship may be $fc = f_s/y$ where y is an integer greater than 1 and may be equal to 4.

The SSB signal, which may comprise an RF, IF or base-band signal, may be band limited to prevent aliasing and provide far-out adjacent channel isolation.

The band limited signal may be obtained by bandpass filtering in a roofing filter and improved selectivity can also be obtained by adjusting the nominal carrier or IF frequency band (equal to $f_s(n \pm 1/y)$ if the local oscillator frequency is $f_s/y$, where n is an integer) so that it is at one end of the passband of the roofing filter. Alternatively, improved selectivity can be obtained by coupling a digital pre-processing filter to the output of the analog-to-digital converter means and adjusting the nominal carrier or IF frequency band so that it is at to the centre of the passband of the roofing filter.

BRIEF DESCRIPTION OF THE DRAWINGS

The present invention will now be described, by way of example, with reference to the accompanying drawings, wherein.

Figure 1:
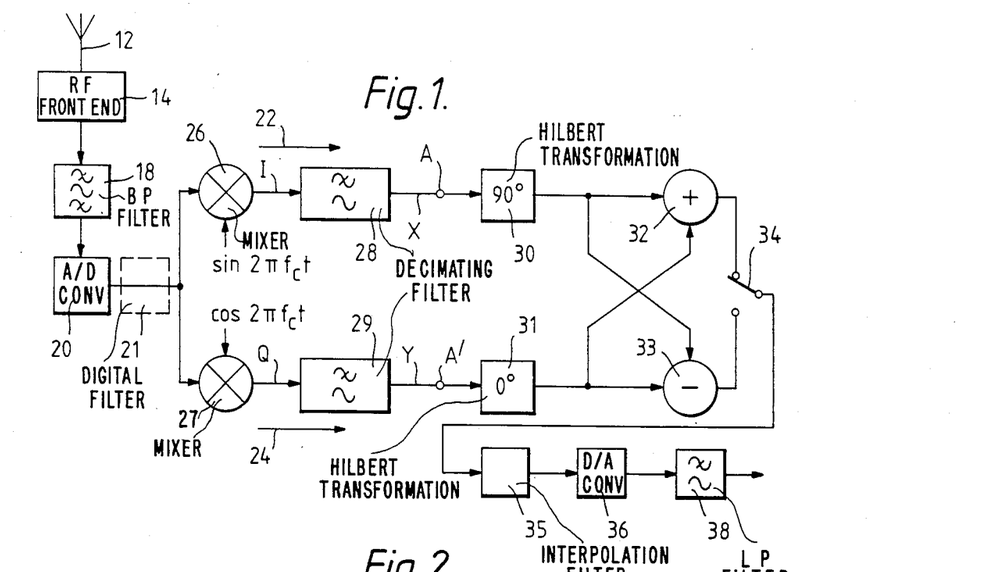
FIG. 1 is a block schematic circuit diagram of a superheterodyne digital radio receiver having an output stage for demodulating an SSB signal.

Referring to FIG. 1 the receiver comprises an antenna 12 connected to an r.f. front end 14 which may consist, for example, of an amplifier or a mixer, the latter possibly together with at least one IF stage. The output of the r.f. front end 14 comprises a signal based on a nominal carrier or IF frequency which in the case of SSB is suppressed. This output signal is fed to a bandpass filter 18, termed a roofing filter, which provides a band limited output to prevent aliasing and achieve adjacent channel isolation. The filtered signal is applied to an analog-to-digital converter (ADC) 20 which samples at a frequency $f_s$, which is greater than twice the signal bandwidth; typically $f_s=40$ kHz. The bandwidth (BW) of the roofing filter 18 in the present embodiment is fixed and is determined by the widest BW signal to be demodulated. However the filter 18 may have a variable bandwidth to ease the analogue to digital conversion.

The digitised output from the ADC 20 is applied to quadrature related digital signal paths 22 and 24. The block shown in broken lines comprises a digital filter 21 which is optional but if present it has an input coupled to the ADC 20 and an output coupled to the paths 22 and 24. The paths 22 and 24 comprise mixers 26, 27 to which digitised versions of sin $2\pi f_c t$ and cos $2\pi f_c t$ respectively are applied, $f_c$ being typically $f_s/y$, where y may be equal to 4 in order that a simple approximation can be made to obtain digital quadrature feed (at a sample rate $f_s$) to the mixers 26, 27 in the paths 22 and 24. Because this quadrature feed is in the form of samples it will be appreciated that its spectrum when $f_c=\frac{1}{4}f_s$ contains components of frequencies $f_s(n\pm\frac{1}{4})$ where n is an integer. It will be noted that the component at $f_s(11+\frac{1}{4})$ is 450 KHz, i.e. very close to a standard superhet I.F. frequency, when $f_s=40$ KHz. The outputs of the mixers 26, 27 are baseband signals which are applied to respective decimating digital filters 28, 29. The pass bands of the filters 28, 29 are narrower than that of the roofing filter 18, and in operation these filters low pass filter the signals to remove any possible aliasing components, and then decimate the results using a predetermined oddnumbered integer factor m greater than 1. Decimation may be achieved either by calculating a respective filter output signal sample for every input signal sample and then discarding m−1 out of every m resulting output signal samples or, more efficiently, by only calculating an output signal sample once for every m input signal samples (while still using all the relevant input signal samples for each calculation). The outputs X and Y of the decimating filters 28, 29 are applied to a Hilbert transform pair 30, 31. The stage 30 has the characteristic that it gives a −90 degree phase shift for a signal lying in the frequency band from 0 to $f_s/2$ and +90 degrees for a signal lying in the frequency band $-f_s/2$ to 0, where $f_s$ is its input sample rate. This pattern repeats throughout the spectrum. The stage 31 of the Hilbert transform pair is a zero phase shift stage formed by a delay network to delay the signal by an amount corresponding to the delay in the stage 30. The decimating filters 28, 29 and the Hilbert transform stage 30 are implemented as finite impulse response (FIR) filters such as transversal filters. By decimating the signals in the filters 28, 29, then the Hilbert transform stage 30 can be operated at a lower sampling rate and therefore requires fewer stages. The outputs from the Hilbert transform pair 30, 31 are applied to respective inputs of a summing network 32 if lower sideband demodulation of an SSB signal is required, or of a subtracting network 33 if upper sideband demodulation of a signal is required, the particular demodulation being selected by operation of a switch 34, coupled to the networks 32, 33.

After the particular arithmetic operation the digital sum (or difference) signal is reconverted to an analogue signal by a digital to analogue converter (DAC) 36 and the output therefrom is applied to a low pass filter 38. If desired an interpolating filter 35 may be connected in the signal path to the DAC 36. An advantage of using the interpolating filter 35 is that the specification for the low pass filter 38 can then be relaxed as the periodic repeat frequency components are further away from baseband.

The digitally operating section of the receiver can be implemented by a suitably programmed microcomputer such as a Texas Instruments TMS 320. By operating digitally one achieves perfect tracking between the signal paths 22, 24.

In determining the operation of the demodulator of FIG. 1 one selects a local oscillator frequency and decimation factor such that the Hilbert transform stage 30 gives rise to a bandpass filtering characteristic within the bandwidth of the roofing filter 18.

Figure 4:
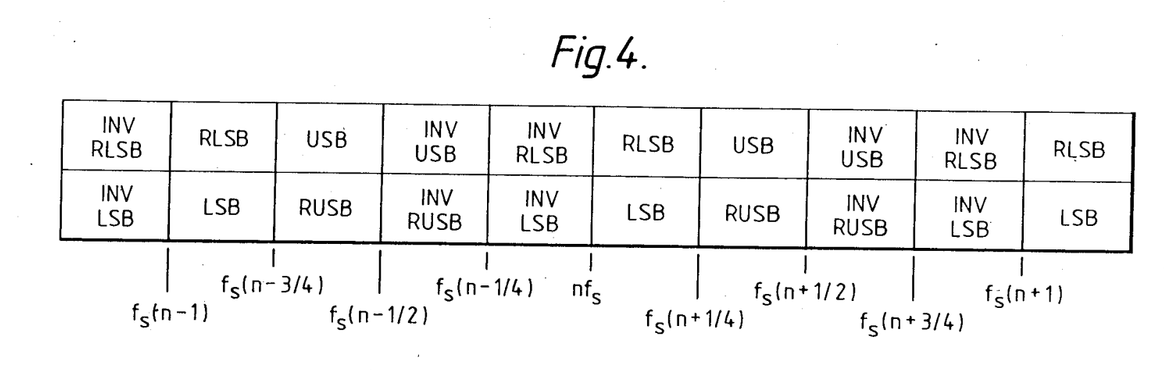
FIGS. 4 to 7 are tabular summaries of no decimation and decimation by 4, 3 and 5 respectively of the periodic filtering characteristic for the USB or LSB signals.
Figure 5:
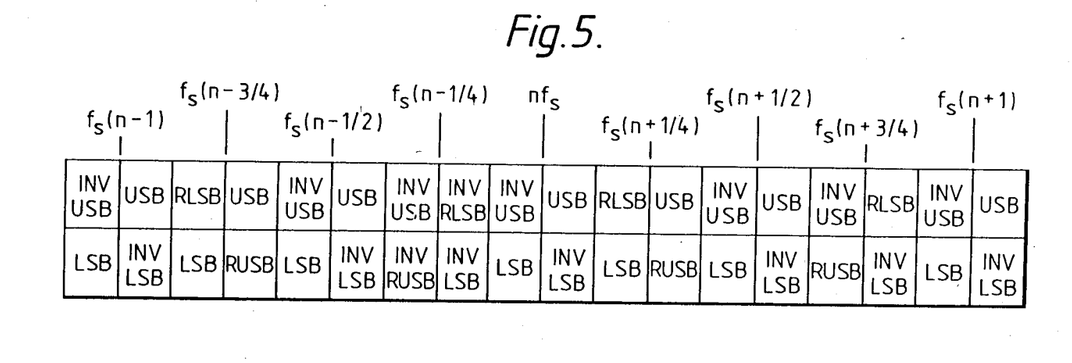

FIGS. 4 to 7 are tabular summaries showing the composite performance of the LSB and USB channels for different incident SSB frequencies. FIG. 4 shows the periodic filtering characteristic when there is no decimation in the decimating filters 28, 29 and FIG. 5 shows the case when the decimation factor is 4. The upper tabular summary relates to the upper side band (USB) subtraction channel and the lower tabular summary relate to the lower side band (LSB) addition channel. The other legends used in the tabular summaries are RUSB—rejected upper sideband, RLSB—rejected lower sideband and INV—inverted.

Figure 6:
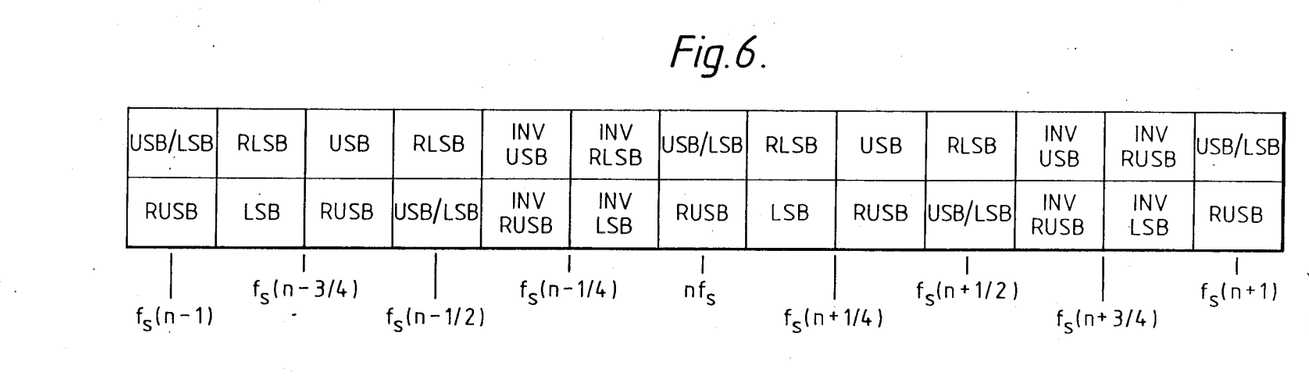
Figure 7:
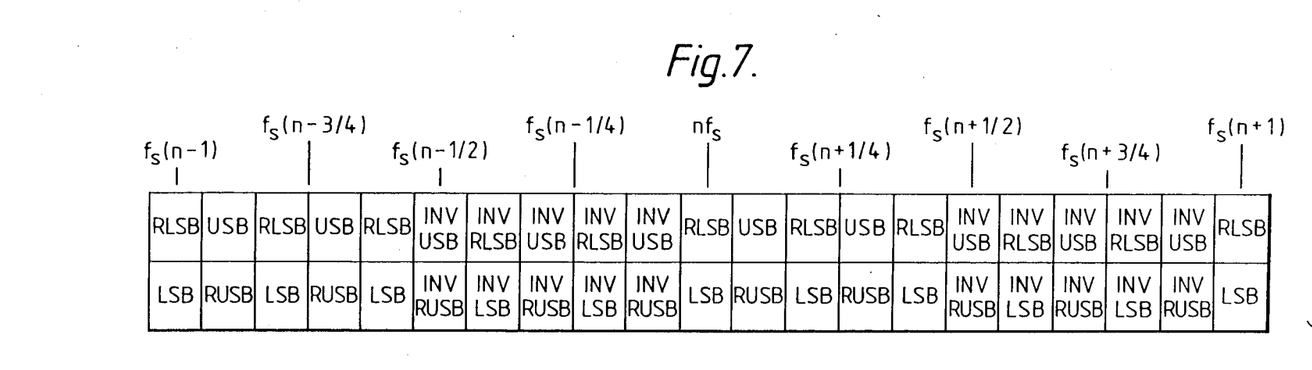

FIGS. 6 and 7 show the periodic filtering characteristics when the decimation factors are 3 and 5, respectively. An examination of these filtering characteristics shows that the frequency length of the segments becomes shorter for higher values of the decimation factors. Also there are points in the tabular summaries where it is possible to note some advantageous operating points. For example when a particular wanted sideband is flanked between two rejection bands then this considerably eases the analogue prefiltering requirements of the demodulator. Such advantageous operating points exist in regions corresponding to the nominal carrier $f_c=(n\pm\frac{1}{4})f_s$ but only for schemes incorporating decimation by an odd integer factor (as exemplified in FIGS. 6 and 7).

There can be a disadvantage in making the passband/stopband segments too small in that the periodic filtering characteristic may revert too soon back to passband within the pass bandwidth of the roofing filter 18 leading to reduced selectivity and consequent degradation of the receiver performance. Another reason for not making the passband segments too narrow is that they may become narrower than the passband of the wanted signal.

Figure 8:
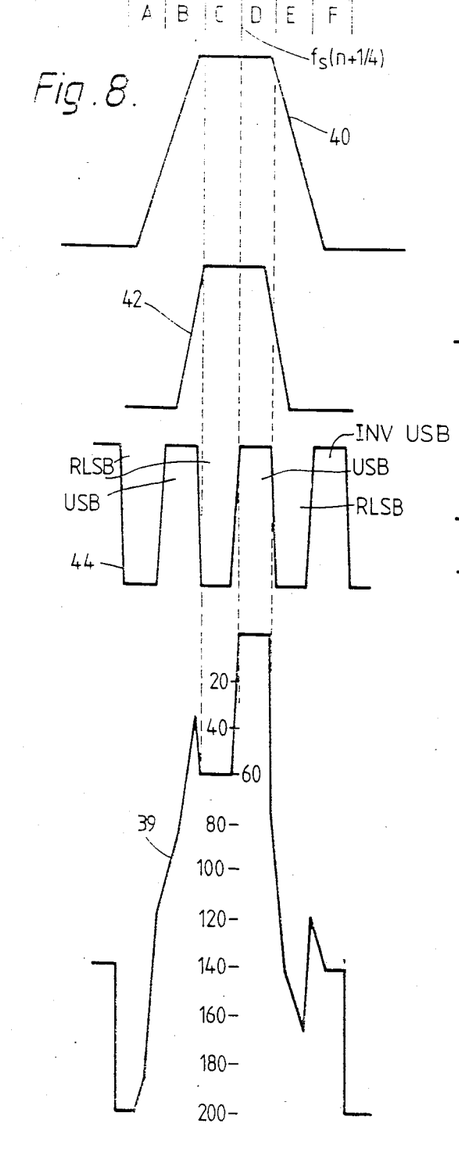
FIGS. 8 and 12 are SSB selectivity charts for a receiver not including a digital pre-decimation filter, in the case of FIGS. 9 to 12 the various passbands have been overlaid one on the other.

FIG. 8 shows the filter response 39 for a demodulator of the type shown in FIG. 1 without a digital filter 21 and in which the decimating factor is five and the nominal IF frequency of $f_s(n+\frac{1}{4})$ is set centrally within the roofing filtering passband 40. The decimating filter passband 42 is narrower than the roofing filter passband 40 and is disposed symmetrically with respect to the passband 40. The periodic filtering characteristic 44 for USB demodulation is also shown together with the legends relating to what is happening in the respective segments which have been identified at the top of FIG. 8 by the letters A to F. In the situation outlined an apparently satisfactory demodulator performance is degraded by a small portion of the next but one channel (dictated by the filtering characteristic 44), segment B, being insufficiently attenuated by the decimenting filters and giving only 40 dB adjacent channel rejection. This situation can be mitigated by the provision of the digital filter 21. Alternatively the value of $f_s$ can be adjusted slightly so that the wanted USB lies in the centre of the roofing filter passband characteristic 40 but the unwanted channel B is further down the slope of the characteristic 40 and so is attenuated.

Figure 9:
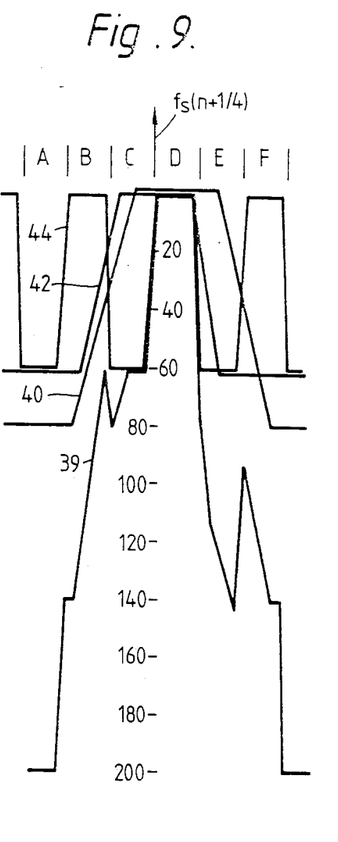

FIG. 9 shows that adjusting $f_s$ in this manner leads to a 60 dB rejection over the adjacent channels. However this is at the expense of not being able to have fast switching between USB (segment D) and LSB (segment C) (FIG. 8) simply by reversing the sign in the SSB phasing algorithm as this does not give equal adjacent and neighbouring channel isolations. Furthermore adjusting $f_s$ may require altering the division ratio in a frequency synthesiser and this does not always lead to convenient round numbers. Thus $f_s(n+\frac{1}{4})$ cannot always be positioned as desired.

Figure 10:
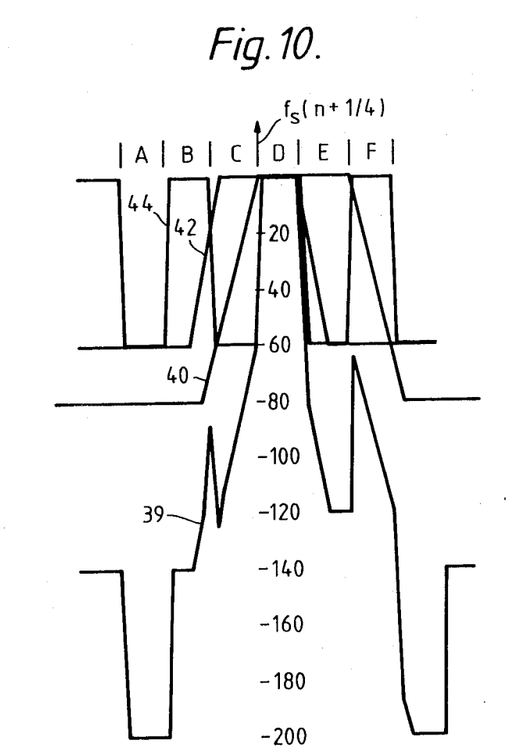

FIG. 10 illustrates the overall characteristic when the local oscillator frequency is adjusted so that the nominal IF frequency $f_s(n+\frac{1}{4})$ lies against the cut-off point of the roofing filter characteristic 40.

Figure 11:
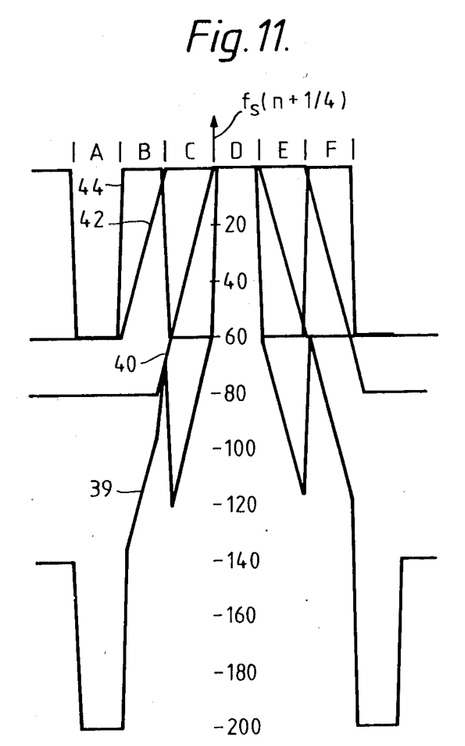
Figures 12, 13:
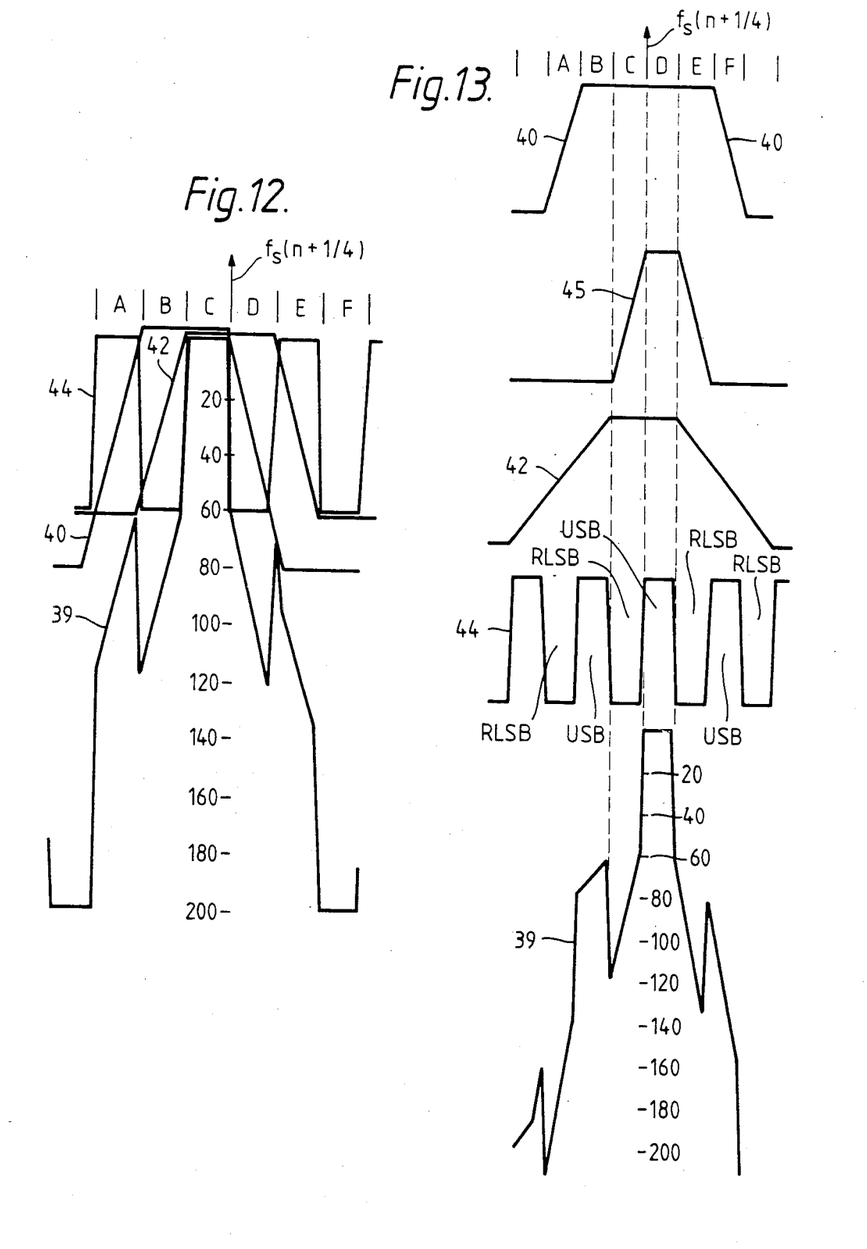
FIG. 13 is an SSB selectivity chart for a receiver including a digital pre-decimation filter.

FIGS. 11 and 12 illustrate the selectivity of the demodulator to obtain USB and LSB for an arrangement in which the passband of each decimating filter has been relaxed so that it reaches its stopband when the periodic filtering characteristic enters its adjacent passband. To switch between upper and lower sidebands the nominal IF frequency is required to switch two channel widths so that the frequency of $f_s(n+\frac{1}{4})$ remains positioned against the edge of the roofing filter characteristic 40, at the lower frequency edge for the USB (FIG. 11) and at the higher frequency edge for the LSB (FIG. 12).

Reducing the decimating factor from 5 to 3 may improve the overall demodulator performance because the segments are wider and in consequence the unwanted channel either is further down the slope of the characteristic 40 or lies outside the passband of the roofing filter.

The alternative arrangement for obtaining an SSB signal with a satisfactory sideband rejection includes the digital preprocessing filter 21 (FIG. 1). Additionally as shown in FIG. 13 the passbands of the roofing filter, response curve 40, and the decimating filters, response curve 42, are different from the arrangement not having the filter 21, see FIG. 8 for example. The response of the digital pre-processing filter 21 is referenced 45 and as shown the passband corresponds to the width of one of the passbands of the periodic filtering characteristics and has a sharp cut-off which is desirable for good selectivity with SSB.

In operation the analogue output of the R.F. front end 14 is applied to the roofing filter 18. The filtered analogue signal is digitised in the ADC 20 and the digital output is filtered in the digital filter 21. In mixing the output of the filter 21 in the mixers 26, 27 the frequency $f_s$, which in this example is four times higher than $f_c$, is selected so that $f_s(n+\frac{1}{4})$ with a given value of n is symmetrically disposed with respect to the passbands of the roofing and decimation filters 18 and 28, 29 respectively. After decimating the signals in the paths 22, 24, the Hilbert transform is obtained and the appropriate sideband is obtained, as before, by addition or subtraction.

The foregoing description is concerned with demodulating an SSB signal.

Figure 2:
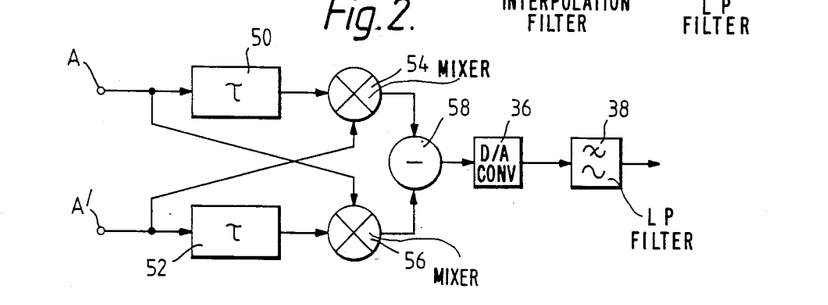
FIG. 2 is a block schematic circuit diagram of an FM output stage which can be used with the SSB output stage.

The circuit shown in FIG. 1, omitting the digital pre-processing filter 21 can be made universal to AM, FM and SSB by connecting different end stages to the points A and A' in the paths 22 and 24, respectively. FIG. 2 illustrates an arrangement for recovering a digitised FM signal. This arrangement comprises delays 50, 52 providing a delay $\tau=m/f_s$ where m is an integer, coupled to the terminals A and A', respectively. Mixers 54, 56 are provided, each mixer has two inputs, one input of each mixer being coupled to a respective delay 50, 52 and the other input of each mixer being coupled to the non-delayed signal in the other path. The outputs of the mixer 54, 56 are coupled to respective inputs of a subtractor 58 from which a digital version of the FM signal is derived. This signal is applied to the DAC 36 and filtered in the low pass filter 38.

Figure 3:
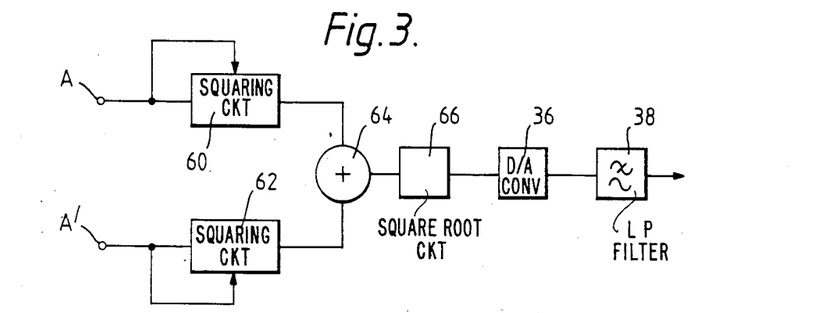
FIG. 3 is a block schematic circuit diagram of an AM output stage which can be used with the SSB and/or FM output stages.

FIG. 3 illustrates that AM can be recovered by squaring the signals at A and A' in squaring circuits 60, 62, the outputs of which are added together in a summing stage 64 after which the sum signal is applied to a square root stage 66 to obtain a digital version of the demodulated AM signal. This digital signal is converted to an analogue signal and low pass filtered in the stages 36, 38, respectively.

The embodiment described is based on the concept of analogue filtering an input signal, effectively directing the result into a pair of quadrature-related signal paths and digitising it, digitally filtering and decimating the signals in the two paths using an odd numbered integer decimation factor greater than 1, Hilbert filtering the decimated signal in one path, and arithmetically combining the result with the decimated signal in the other path to obtain the required selectivity. By this approach the specification of the roofing filter 18 can be relaxed. If the demodulator is designed for demodulating SSB signals only then the passband of the roofing filter 18 can be a gently sloping single channel one, the digital filtering being used effectively to cut-out a slot having sharp or fast sloping sides. By relaxing the specification of the roofing filter then alignment and local oscillator drift problems are avoided.

Alternatively if the demodulator is designed for multi-mode operation then the passband of the roofing filter 18 should be made wide enough to pass full deviation FM. The digital filtering in such a case provides an effective way of obtaining further filtering especially when demodulating SSB signals. In practice there is a relationship between the bandwidth of the roofing filter 18 and the sampling rate in the ADC 20 (FIG. 1) which is that the bandwidth of the roofing filter must be less than $\frac{1}{2}$ the sampling rate, that is the Nyquist frequency. The bandwidh of the roofing filter 18 is dictated by the intended application, that is single mode or multi-mode, and this dictates the required sampling rate. In the illustrated multi-mode case the bandwidth of the roofing filter 18 is chosen to pass full deviation FM and this corresponds to about four SSB sidebands.

Figure 14:
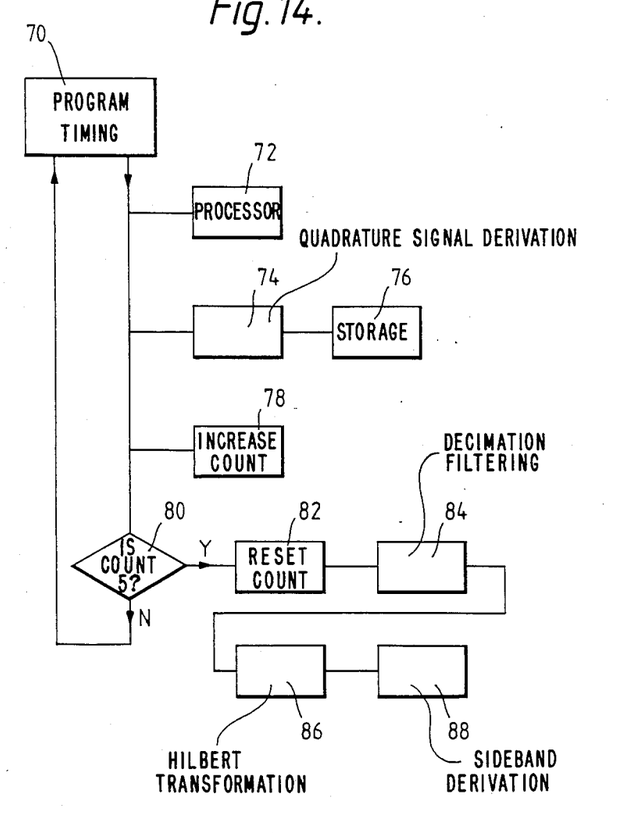
FIG. 14 is a flow chart relating to implementation the digital processing part of the receiver using a microcomputer.

FIG. 14 illustrates a simplified flow chart for the various digital operations implemented by a microcomputer such as a Texas TMS 320 which is running in real time. It will be assumed that the pre-decimation filter 21 has been omitted and an SSB signal is being recovered.

FIG. 14 demonstrates the fundamental operation of the demodulator program. The diagram shows how a loop counter is used to allow decimation by five. A sample rate of 40 kHz is to be used for the data input which would make the design of the Hilbert filter impracticable for any reasonable performance. However in choosing a sample rate of 40 kHz then the quadrature mixing can easily be performed with 10 kHz thus giving a nominal input carrier frequency of 10 kHz. The bandwidth of the two channels is 3 kHz. After the initial quadrature mixing decimation by five is used to reduce the sample rate down to 8 kHz where it is possible to design practical Hilbert filters and make better use of the available processing time.

In FIG. 14 the block 70 is a programme timing block which ensures that sampled data from the A to D converter is ready every 25 µSec. This data is read into the processor, step 72. Step 74 denotes operating on the input sampled data to give two quadrature channels. This is achieved by multiplying the incoming signal with a 10 kHz locally generated pseudo local oscillator. One channel is derived from direct multiplication while the quadrature channel is derived from multiplication with a 90 degrees phase shifted version of the pseudo local oscillator. The next step 76 is to take the signals in the mixer outputs and store them by moving data in a data memory store and updating vacated memory locations. The step 78 denotes increasing the count in a counter by one. Step 80 denotes checking whether the count is 5, if it is not (N) then the cycle is repeated until the count is 5, that is (Y) at which time the program exits to step 82. In step 82 the counter is reset to zero and the data, which is in the correct place, is operated on by the decimation filter coefficients, step 84. Step 86 denotes the Hilbert transform operation, and the step 88 denotes the arithmetic operation to obtain the appropriate sideband.

The operational steps to obtain digital versions of the FM and AM signals are self evident from a consideration of FIGS. 2 and 3 and accordingly separate flow charts will not be described.

In the case of using the digital pre-processing filter 21, this is configured as a 30 stage transversal filter which receives time samples from the analogue to digital converter 20. After a newly received time sample has been stored, each of the stored time samples is multiplied by its individual filter coefficient and the results are accumulated to provide an output to the quadrature related mixers 26, 27. The multiplication and accumulation operations are carried out again after the receipt of another time sample.

Since the use of the pre-processing filter 21 enables the specification for the decimation filters 28, 29 to be relaxed, then each filter comprises only eight stages.

It will be appreciated that the arrangement of FIG. 1 could alternatively be supplied with base-band input signals. If this is the case the aerial 12 and r.f. front-end will, of course, be omitted and the band-pass filter 18 (and 21 if present) be replaced by a low-pass filter or filters. It will also be appreciated that the required relationship between the signals in the paths 22 and 24 can alternatively be obtained by producing a phase difference of 90 degrees between the signals fed from the aerial 12 to the mixers 26 and 27 respectively, and feeding the other inputs of these mixers with in-phase or anti-phase local oscillator signals. If this is done a 90 degree phase-shifter may be included in the coupling between ADC 20 and one of the mixers 26 and 27 or, for example, a ±45 degree phase shifter may be included in the coupling from ADC 20 to one of these mixers and a −45 degree phase-shifter in the coupling from ADC 20 to the other. Yet another possible variation of the circuit of FIG. 1 is to replace ADC 20 by a pair of ADCs, one between mixer 26 and filter 28 and the other between mixer 27 and filter 29, so that the mixers 26 and 27 become analog mixers (fed with non-digitized local oscillator signals).

Although as described component 30 of the Hilbert transform pair 30,31 produces the whole of the +90 degree, −90 degree phase shift characteristic required between the two signal paths it will be evident that the production of this characteristic may be shared between the components 30 and 31, for example by arranging that component 30 has a ±45 degree, −45 degree phase shift characteristic and component 31 has a −45 degree, ±45 degree phase shift characteristic at corresponding frequencies.

We claim:

1. An improved method of demodulating an SSB signal, which method comprises:
   analog filtering the SSB signal;
   subjecting the filtered SSB signal to analog-to-digital conversion at a sampling frequency $f_s$ and to quadrature mixing with a locally generated carrier wave at a frequency $f_c = f_s/y$, where y is an integer greater than 1, so as to derive a pair of quadrature-related digital signals;
   applying the respective quadrature-related digital signals to respective signal transmission paths in which they are each digitally filtered and decimated; and
   combining the decimated digital signals from both of said transmission paths to derive a demodulated digital SSB signal;
   such improvement being characterized in that:
   the quadrature-related digital signals are digitally filtered and decimated in each transmission path using a decimation factor whichis an odd-numbered integer greater than 1; and
   in one of said paths the decimated digital signal therein is thereafter subjected to a Hilbert transform operation producing a −90° phase shift of frequency components thereof which are in an upper sideband extending from fc to +fs/2 and producing a '90° phase shift of frequency components thereof which are in a lower sideband extending from $f_c$ to −fs/2;
   whereby the combined demodulated digital SSB signal is derived in a frequency passband which is flanked by frequency stopbands.

2. A method as claimed in claim 1, wherein the analog-to-digital conversion is effected prior to the quadrature mixing operation.

3. A method as claimed in claim 1, wherein y=4.

4. A method as claimed in claim 1, wherein the frequency passband of the analog filtering operation is centered on a frequency of $f_s(n \pm 1/y)$ where n is an integer.

5. A method as claimed in claim 1, wherein the frequency passband of the analog filtering operation has a cut off frequency of $f_s(n \pm 1/y)$ where n is an integer.

6. An improved SSB analog signal demodulator, which demodulator comprises:
   an analog filter which receives the SSB analog signal and produces a filtered SSB analog signal at an output thereof;
   first and second signal transmission paths and means coupling such paths to the output of said analog filter, such coupling means effecting analog-to-digital conversion at a predetermined sampling frequency $f_s$ and mixing with locally generated carrier waves at a predetermined frequency $f_c=f_s/y$, where y is an integer greater than 1, to thereby convert the filtered SSB signal to respective digital signals which are respectively coupled to said first and second transmission paths, the locally generated carrier waves being in quadrature so that the respective digital signals are in quadrature;

first and second digital decimating filters respectively comprised in said first and second transmission paths, the decimating filter in each transmission path decimating the digital signal therein to derive a decimated digital signal at an output of such filter, the decimated signals so produced at the outputs of the first and second decimating filters being in quadrature;

and signal combining means coupled to the outputs of the first and second decimating filters for combining the decimated digital signals in both of said transmission paths to derive a demodulated digital SSB signal;

such improvement being characterized in that:
said first and second decimating filters respectively decimate the digital signals in the first and second transmission paths by a decimation factor which is an odd-numbered integer greater than 1; and the outputs of said first and second decimating filters are coupled to said signal combining means by respective Hilbert transform stages, the Hilbert transform stage coupled to the output of the first decimating filter producing a $-90°$ phase shift of frequency components of the decimated signal in the first transmission path which are in an upper sideband extending from $f_c$ to $+f_s/2$, and producing a $+90°$ phase shift of frequency components of such decimated signal which are in a lower sideband extending from fc to $-f_s/2$; the Hilbert transform stage coupled to the output of the second decimating filter delaying the decimated digital signal in the second transmission path without phase shifting thereof;

whereby said demodulator has a frequency selectivity characteristic comprising a frequency pass-band flanked by frequency stop-bands, the demodulated digital SSB signal being derived within said frequency pass-band.

7. A demodulator as claimed in claim 6, wherein $y=4$.

8. A demodulator as claimed in claim 6, wherein the frequency pass band of the analog filter is centered on a frequency of $f_s(n\pm 1/y)$ where n is an integer.

9. A demodulator as claimed in claim 6, wherein the frequency pass band of the analog filter has a cut-off frequency of $f_s(n\pm 1/y)$ where n is an integer.

* * * * *